United States Patent [19]

Seeger, Jr. et al.

[11] Patent Number: 4,775,439

[45] Date of Patent: Oct. 4, 1988

[54] METHOD OF MAKING HIGH METAL CONTENT CIRCUIT PATTERNS ON PLASTIC BOARDS

[75] Inventors: Richard E. Seeger, Jr., Kittery Point, Me.; Noredin H. Morgan, Woburn, Mass.

[73] Assignee: Amoco Corporation, Chicago, Ill.

[21] Appl. No.: 516,677

[22] Filed: Jul. 25, 1983

[51] Int. Cl.⁴ .................. B29B 1/00; B44C 1/16; B29C 33/40; B05D 5/12
[52] U.S. Cl. .................. 156/231; 156/239; 156/246; 264/213; 427/96; 427/282
[58] Field of Search ............ 427/96; 174/68.5, 68 R; 156/233, 230, 249, 231, 238, 239, 240, 246, 308.6, 289; 96/282, 287, 258; 264/213

[56] References Cited

U.S. PATENT DOCUMENTS

| | | | |
|---|---|---|---|
| 2,721,152 | 10/1955 | Hopf et al. | 427/96 |
| 2,721,153 | 10/1955 | Hopf et al. | 427/96 |
| 3,589,962 | 6/1971 | Bonjour | 156/233 |
| 3,703,603 | 11/1972 | Levesque et al. | 156/249 |
| 4,049,844 | 9/1977 | Bolon et al. | 427/282 |
| 4,322,316 | 3/1982 | Provance et al. | 427/96 |
| 4,343,833 | 8/1982 | Sawae et al. | 427/96 |
| 4,373,019 | 2/1983 | Watanabe et al. | 427/96 |

Primary Examiner—Michael W. Ball
Assistant Examiner—Louis Falasco
Attorney, Agent, or Firm—Donald M. Papuga; William H. Magidson; Ralph C. Medhurst

[57] ABSTRACT

A low temperature method of forming a circuit pattern on a plastic substrate which comprises applying a slurry of a vaporizable solvent, metal particles and a small quantity of binder in the shape of the circuit pattern desired to a removable layer, vaporizing the solvent, covering the powdered metal and binder with an adhesive to hold the powdered metal and carrier in place on the removable layer, laminating the hydrocarbon containing substrate with pressure and heat to cause compacting of said powder and bonding of said compacted powder to said substrate by adhesive layer, said heat being insufficient to destroy said adhesive, substrate and removable layer, and separation of the removable layer. A circuit pattern held on a removable layer by an adhesive overlying same is also disclosed.

8 Claims, 1 Drawing Sheet

METHOD OF MAKING HIGH METAL CONTENT CIRCUIT PATTERNS ON PLASTIC BOARDS

BACKGROUND OF THE DISCLOSURE

The present invention is directed to plastic boards having extremely high metal content circuit patterns formed thereon. The circuit boards are useful for mounting and interconnecting electrical components thereto.

In the past extremely high metal content circuit patterns in particulate form were laid down on ceramic boards and then heated to form a fused circuit (see U.S. Pat. Nos. 3,729,819, 3,950,200 and 3,576,668). Less expensive boards of plastic materials could not be used in this process since the plastic boards will not withstand the high processing temperatures needed for the fusing of the metal.

While it is possible to form circuits on plastic boards using conventional methods, e.g. spraying, screening and the like, these methods are not as practical as one would like for use in high volume manufacturing operations when using highly loaded metal particulate slurries to form the pathways. Accordingly, a new and improved method and materials were needed to be able to produce high metal content circuit patterns (electrically conductive pathways) on circuit boards. This invention provides additional advantages over current processes in that circuit patterns on release layers (peel-off layers) may be mass produced for customers who can then laminate and transfer such circuit patterns to substrates.

BRIEF DESCRIPTION OF THE DISCLOSURE

In this invention circuit patterns are formed by applying a slurry of a vaporizable solvent, metal particles and a small quantity of binder in the shape of the circuit pattern to be formed on a removable (separatable) layer, e.g. peel-off layer. Thereafter the solvent is vaporized and an adhesive is applied on the remaining metal powder and binder and on the removable layer. Preferably the metal powder is compacted prior to or after applying the adhesive thereover. It is most preferable that the adhesive be a curable adhesive and is preferably applied as a B stage (partially cured) adhesive. Threafter the metal powder and adhesive is laminated to a circuit board using heat and pressure to further compact the metal powder and cure the adhesive and binder. The binder used is preferably one that is curable.

Thereafter the removable layer is separated from the metal powder and adhesive to leave a circuit pattern on the circuit board. The circuit pattern formed herein is highly conductive, e.g. less than 0.1 ohm/sq. and because of compacting as disclosed herein it is possible to reduce the amount of noble metal, e.g. silver, normally used, and yet approach the conductivity of etched copper circuit patterns.

DETAILED DESCRIPTION OF THE DISCLOSURE

Reference should now be had to FIGS. 1 to 6 for a description of the method of the invention.

A metal slurry of metal particles, e.g. noble metals such as silver, palladium, gold and platinum, is preferably mixed with the combination of other metal particles such as nickel and tin. A vaporizable solvent is mixed therewith as well as a small amount of a curable plastic binder. The metal content based on total solids is very high, e.g. over about 93 percent to about 98 percent by weight. Thereafter the slurry is silkscreened or applied in any other conventional manner, as by spraying, etc. to form slurry lines 20 in the shape of the circuit pattern pathways to be ultimately formed on a removable layer 19. The layer 19 is preferably of the release type so that it may ultimately be peeled away. Suitable papers are commercially known as Fish paper and may include a release agent on the surface thereof. An example of a suitably available release layer is sold as Warren's TRANSKOTE ETL106 DUPLEX UNOTO SIDE 67854 FR - - - 1.

Figure 1:
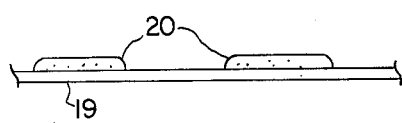
FIG. 1 is a side elevational view showing circuit lines (pathways) as a slurry on a transfer (e.g. peel-off) carrier (layer)
Figure 2:
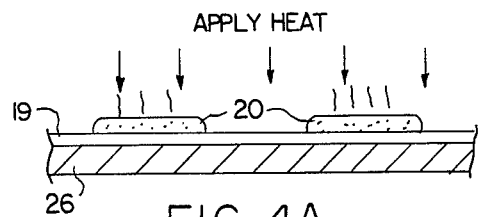
FIG. 2 is a view showing the application of heat to volatilize the solvent in the slurry while the sheet is on a support.
Figure 3A:
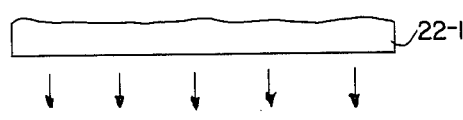
FIG. 3 is a view showing an adhesive applied over the pathways to hold it on the transfer layer during further processing and the application of pressure by a press to compact the pathways.
Figure 3B:
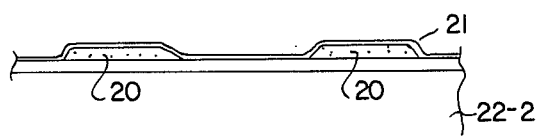
Figure 4A:
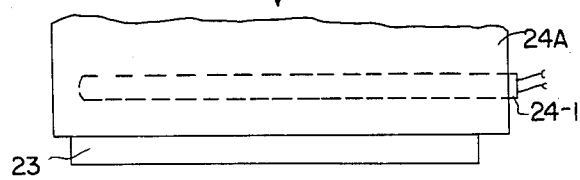
FIG. 4 is a view showing the lamination of pathways to a dielectric board while applying heat and pressure to compact the pathways.
Figure 4B:
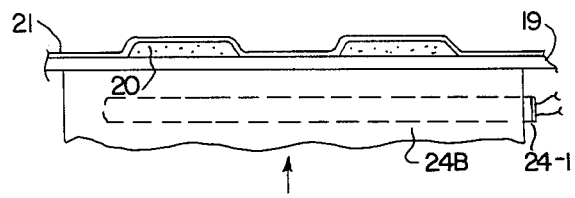

In FIG. 2, there is the application of heat to boil off the solvent, e.g. 330° F. for 10 minutes. The release layer 19 as shown preferably positioned on a support 26. Thereafter the metal particles in lines 20 may be compacted by applying 150 psi by a press for 5 minutes at 330° F. to increase the conductivity. Alternatively an adhesive 21, e.g. a curable plastic adhesive, may first be applied over lines 20 and on the release layer 19 and then compacted by a press comprising sections 22-1 and 22-2 to effect compacting of the particles in the lines 20, e.g. 150 psi at 350° F. for 5 minutes. Preferably sheets of silicone rubber (thermally conductive) 60 mls 65 durometer and Teflon sheet are positioned on both sides of the material being compacted with the Teflon sheet in contact with the paper 19 and the adhesive 21.

Figure 6:
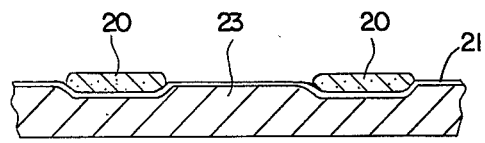
FIG. 6 is an enlarged sectional view taken along line 6—6 of FIG. 5.
Figure 5:
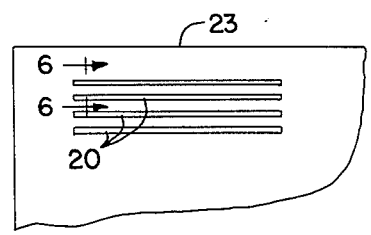
FIG. 5 is a view of the board and circuit pathways after removing the transfer layer.

Thereafter the release layer supporting the lines 20 and the adhesive 21 are positioned in a heated press comprising sections 24A and 24B, having heaters 24-1. The press produces a temperature, e.g. 330°, for 5 minutes, which is sufficient to cure the adhesive and the binder, and cause lamination of the adhesive to a substrate, e.g. plastic (dielectric layer) 23 to form the circuit shown in FIGS. 5 and 6. In addition, the press produces 150 psi to cause a compacting of metal particles in the lines (electrically conductive pathways) 20. In FIG. 6 there is shown the now formed circuit lines 20 which have been partially embedded into the substrate 23 when a thermoplastic type plastic substrate which will partially soften under heat and pressure is used. After step 4 the layer 19 is removed by peeling it off to leave the circuit shown as in FIGS. 5 and 6.

In practicing the method it is most preferred that the contacting surface of the section include a 60 mil silicone rubber layer (thermally conductive) and of 65 durometer. It should also be understood that the substrate 23 may be rigid or flexible.

In practicing this invention various substrates (sometimes referred to as dielectric material) may be used to support the conductive lines (paths). They include thermoplastic and thermoset plastic boards (sheets, panels) commonly used in the printed circuit industry. The substrate may be rigid or flexible depending on whether flexible circuits are to be formed or rigid boards are to be formed. Suitable materials as substrates include the following:

Epoxy-Glass filled G-10, Phenolic, Polimide (e.g. Kapton brand), Polysulfone (e.g. UDEL brand) and polyethermide (ULtem brand).

An adhesive (preferably a curable adhesive) is used to hold the conductive paths of this invention to the substrate and would include various resins or combinations thereof, preferably one that is a B stage (i.e. incompletely cured and post-cured later). The adhesive may be applied to the entire surface which is to support the conductive pathways or only under the overlying pathway. Adhesives (e.g. organic) such as Epoxy (D.G.E.B.A.) type, e.g. EPONE 1009 plus polyisocyanate T.D.I. type e.g. MONDUR CB-60 1:2 ratio may be used, or adhesives based on D.E.N. NOVOLAC brand epoxy resins may also be used as well as other epoxy and polyurethane resins. The preferred adhesive is epoxy e.g. EPON (bisphenol type epoxy) n=8 to 12 aromatic polyisocyanate (e.g. MODUR S) (ratio 1:2) and nitro cellulose as flowing agent also may be added.

The conductive pathways (lines) are prepared initially as a slurry and may be screened or brushed on the adhesive layer which is initially placed on the substrate, or may be applied in any other conventional manner known in the art.

The metal particles in the slurry may comprise noble metals, e.g. silver alone, or metal or inert fillers such as nickel and/or tin, glass. However, to achieve acceptable conductivity, e.g. 0.1 to 0.01 ohm/sq., the silver particle content should be between 15 to 98 percent of the total metal content in the pathway depending how much filler is used. The slurry will include a curable resin with amount by weight in the conductive pathway being preferably no more than about 7 percent, and no less than about 2 percent, with 6 to 4 percent being most preferred.

The curable plastic resin (binder) may be selected from the high temperature types such as phenol blocked isocyanate, epoxy (NOVOLAC brand) mixed with a polyvinyl acetal, e.g. polyvinyl butyral resin (BUTVAR brand) or polyvinyl formal resin (FORMVAR brand) mixed with epoxy such as D.G.E.BA type with n=7-12. In order to form the slurry, solvents such as cellosolve acetate, n-butyl carbitol, n-methyl-2-pyrolidone, N,N-dimethyl formamide may be used. The solvent will be boiled (vaporized) off during the curing process. Additionally catalysts such as trifluoro sulfonic acid, cobalt-naphtanate paratoluene sulfonic acid, phoric acid or others useful in a particular resin may be used as would be understood by one skilled in the art.

The noble metal particles used are preferably silver e.g. Silflake 135, nickel powder of microns in average size and tin, e.g. tin 266, may be added as well as other metals.

The pathways can be provided with the solder film surface of a conventional solder formulation used in the electronics industry, e.g. 63 tin and 37 lead or 60 tin and 40 lead. In order to better form the film on the pathway it is preferable that the pathways be initially plated with a metal such as preferably nickel. Plating may be from an electroless nickel plating bath or electrolytic plating techniques may be used.

A typical slurry for making the electrically conductive pathways is prepared as follows from the following ingredients
(parts by weight)

| Item | Material | |
|---|---|---|
| 1. | Polyvinyl formal resin (FORMVAR brand) NO 15/95 E 13.75% in N—methyl-2 pyrolidone (monsanto) | |
| | wet weight 14.38 | dry weight 1.97 |
| 2. | Epoxy NOVOLAC (100%) Dow Chemical | DEN 431 wet and dry weight 3.0 |
| 3. | Silflake 135 | wet and dry weight 25 |
| 4. | Nickel powder (size) | wet and dry weight 60 |
| 5. | Tin 266 | wet and dry weight 10 |
| 6. | Diacetone alcohol | wet weight 10 |

Step I:
The items 1, 4 and 5 and one part of item 6 are stirred together and two passes are made through a three roll mill to make a homogenous mixture.

Step II:
Thereafter items 2 and 3 and 3.5 parts of item 6 are stirred and the resulting material is passed twise through a three roll mill to make a homogenous mixture.

Step III:
The mixtures from steps I and II are combined in a three roll mill until a homogenous mixture is formed.

Step IV:
5.5 parts of item 6 are added to the product of Step III for screening or brushing on the substrate on top of the adhesive.

The amount of solvent used will be altered depending upon its application and the substrate used as will be apparent to one skilled in the art.

What is claimed is:

1. A low-temperature method of forming a circuit pattern on a plastic substrate, which comprises the steps of:
   (a) applying a slurry, comprising a vaporizable solvent, greater than about 93 percent to about 98 percent by weight of powdered noble metal and a small quantity of binder in the shape of the circuit pattern desired, to a release layer;
   (b) vaporizing the solvent;
   (c) covering the powdered metal and binder with a curable adhesive layer to hold the powdered metal in place on the release layer;
   (d) providing a plastic substrate;
   (e) laminating the plastic substrate with pressure and heat to cause compacting of said powder and bonding of said compacted powder to said substrate by said curable adhesive layer, which adhesive is cured, said heat being insufficient to destroy said plastic substrate and release layer; and
   (f) separation of the release layer from the metal powder and adhesive to leave a circuit pattern on the plastic substrate.

2. The method of claim 1 in which the pattern is compacted prior to or after covering the powdered metal and binder with the adhesive.

3. The method of claim 1 or claim 2 in which the slurry includes an amount of silver which is less than about 50 percent by weight of the solids in the slurry.

4. The method of claim 1 or claim 2 in which solder flux is applied in the slurry.

5. The method of claim 1 in which the powdered metal includes fluxing lubricants.

6. The method of claim 1 in which the powdered noble metal includes other metal particles.

7. The method of claim 6 wherein the other metal is nickel.

8. The method of claim 6 wherein the other metal is tin.

* * * * *